(12) United States Patent
Weiss

(10) Patent No.: US 8,643,372 B2
(45) Date of Patent: Feb. 4, 2014

(54) RF SAFE TRANSFORMER-COUPLED TRANSMISSION LINE FOR MRI WITH REDUCED ARTIFACTS

(75) Inventor: Steffen Weiss, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 68 days.

(21) Appl. No.: 13/142,900

(22) PCT Filed: Jan. 20, 2010

(86) PCT No.: PCT/IB2010/050245
§ 371 (c)(1),
(2), (4) Date: Jul. 12, 2011

(87) PCT Pub. No.: WO2010/086762
PCT Pub. Date: Aug. 5, 2010

(65) Prior Publication Data
US 2011/0267151 A1   Nov. 3, 2011

(30) Foreign Application Priority Data

Jan. 27, 2009 (EP) .................... 09151395

(51) Int. Cl.
*G01V 3/00* (2006.01)

(52) U.S. Cl.
USPC ............................ 324/322; 324/318; 600/423

(58) Field of Classification Search
USPC ........................... 324/318–322; 600/407–429
See application file for complete search history.

(56) References Cited

U.S. PATENT DOCUMENTS

| | | | | |
|---|---|---|---|---|
| 5,807,253 | A * | 9/1998 | Dumoulin et al. | 600/410 |
| 7,205,768 | B2 * | 4/2007 | Schulz et al. | 324/322 |
| 7,728,594 | B2 * | 6/2010 | Vernickel et al. | 324/322 |
| 7,777,588 | B2 * | 8/2010 | Gleich et al. | 333/24 R |
| 7,834,270 | B2 * | 11/2010 | Zhu et al. | 174/105 R |
| 8,285,365 | B2 * | 10/2012 | Weiss et al. | 600/427 |
| 2002/0109503 | A1 * | 8/2002 | Kestler et al. | 324/318 |
| 2005/0218897 | A1 * | 10/2005 | Schulz et al. | 324/322 |
| 2009/0251236 | A1 * | 10/2009 | Gleich et al. | 333/24 R |

FOREIGN PATENT DOCUMENTS

| | | |
|---|---|---|
| WO | WO2004038443 | 6/2004 |
| WO | WO2006003566 | 1/2006 |
| WO | WO2006067703 | 6/2006 |

OTHER PUBLICATIONS

S. Weiss et al., "Transmission Line for Improved RF Safety of Interventional Devices", Magnetic Resonance in Medicine 54:186-189 (2005).
M. Bock et al., "MR-Guided Intravascular interventions: Techniques and Applications", Journal of Magnetic Resonance Imaging 27:326-338 (2008).
K. Ratnayaka et al., "Interventional Cardiovascular Magnetic Resonance: still tantalizing", Journal of Cardiovascular Magnetic Resonance 2008, 10:62, pp. 1-23.
A. Krafft et al., "B1 Field-Insensitive Transformers for RF-Safe Transmission Lines", Magn. Reson. Mater. Phys. (2006) 19:257-266.
Ackermann D.L. et al., Proc. of 5th SMRM, 1131 (1986).

(Continued)

*Primary Examiner* — Sanjay Cattungal

(57) ABSTRACT

An electrically conductive transmission line is configured for use in the magnet bore of a magnetic resonance system and includes at least one inductive coupling element for coupling at least two lead segments of the line. The coupling element includes a paramagnetic and/or ferromagnetic material.

13 Claims, 6 Drawing Sheets

(56) References Cited

OTHER PUBLICATIONS

C. L Dumoulin et al., "Real time position monitoring of invasive devices using magnetic resonance", Magn. Reson. Med. 29, 411-415 (1993).

Ladd ME, Quick HH, Boesiger P, McKinnon GC. RF heating of actively visualized catheters and guidewires. In: Proceedings of the ISMRM, 6th Scientific Meeting and Exhibition, Sydney, 1998. p. 473.

Konings M K, Bartels L W, Smits H F M and Bakker C J G 2000 Heating around intravascular guidewires by resonating RF waves J. Magn. Reson. Imaging 12 79-85.

Nitz WR, Oppelt A, Renz W et al. On the heating of linear conductive structures as guide wires and catheters in interventional MRI. J Magn Reson Imaging 2001;13:105-114.

Vernickel P, Schulz V, Weiss S, Gleich B. A Safe Transmission Line for MRI. IEEE Trans BME 2005;52(6):1094-1102.

\* cited by examiner

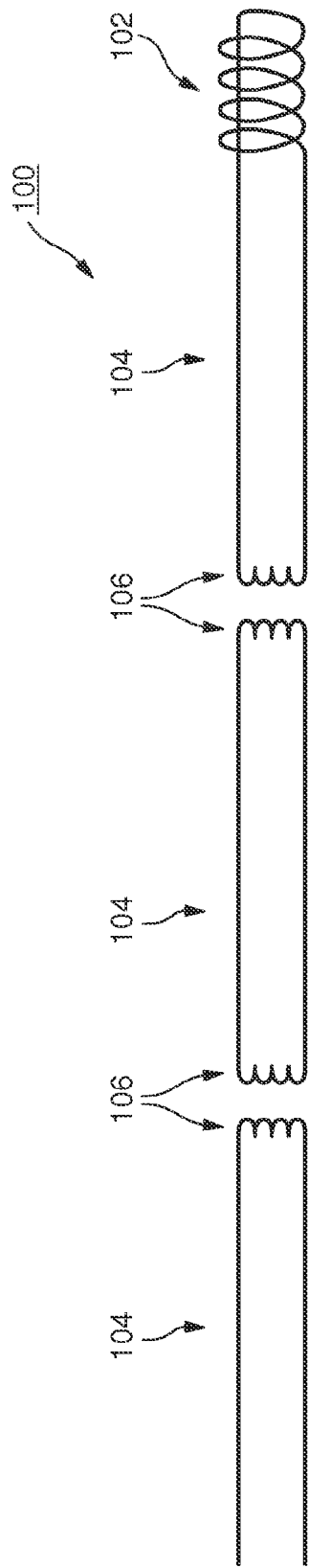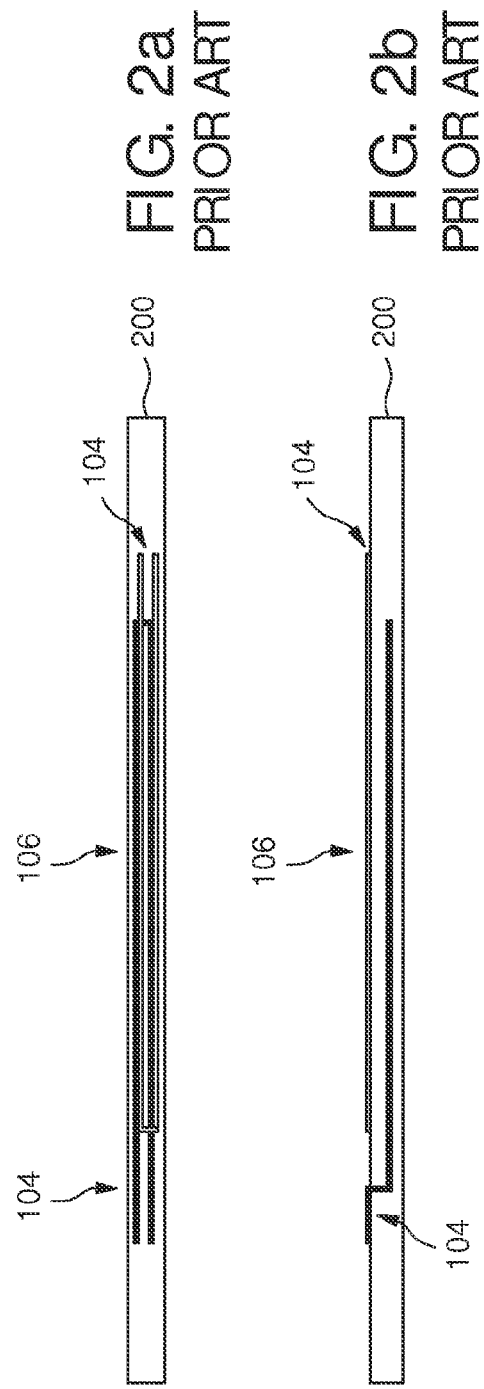

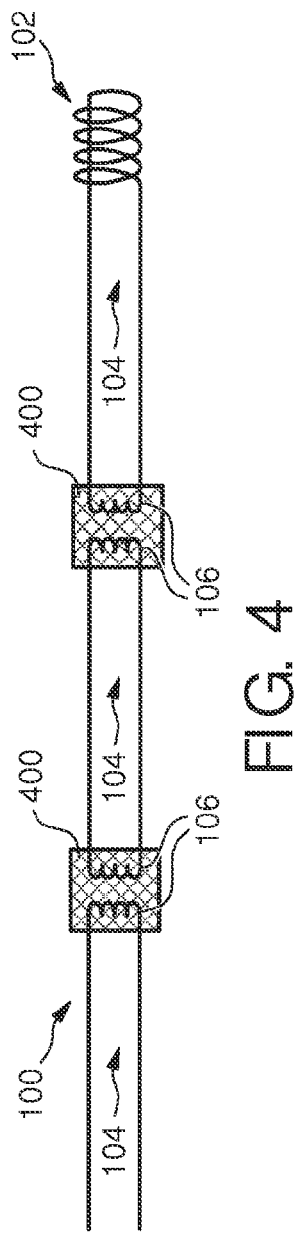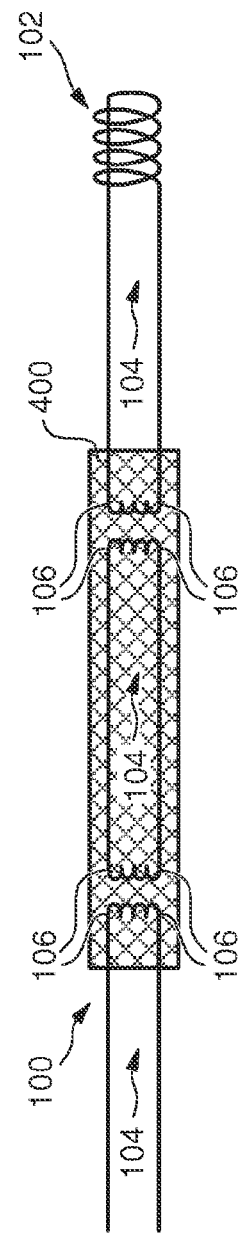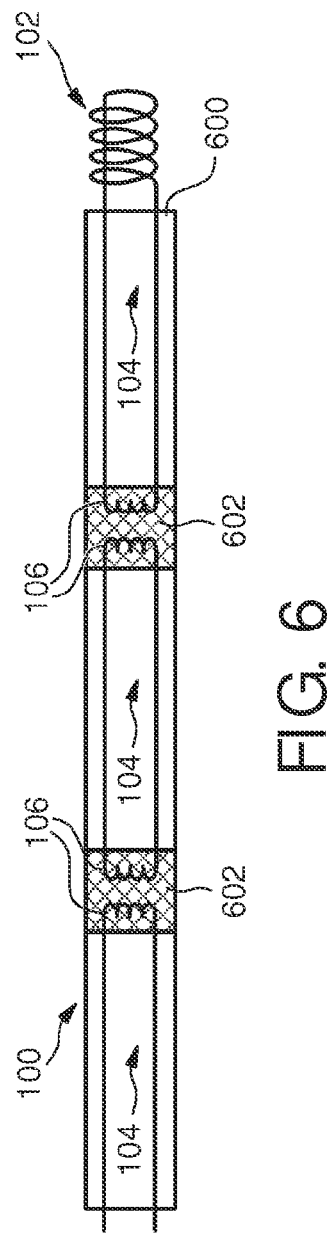

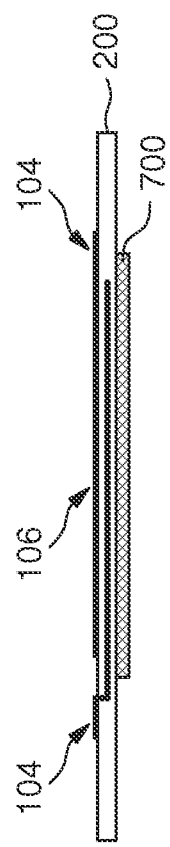
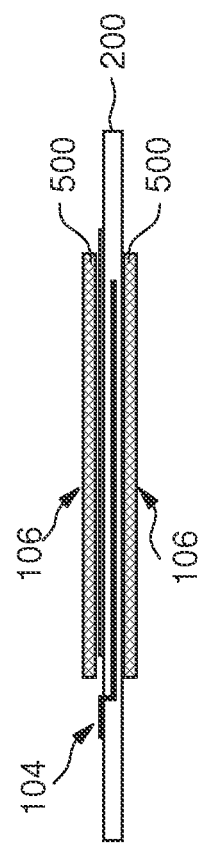
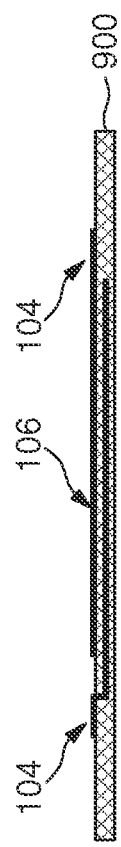

RF SAFE TRANSFORMER-COUPLED TRANSMISSION LINE FOR MRI WITH REDUCED ARTIFACTS

BACKGROUND OF THE INVENTION

The present invention relates to an electrically conductive transmission line adapted for use in the magnet bore of a magnetic resonance system, and an invasive medical instrument comprising a transmission line and a magnetic resonance coil used for tracking or imaging and a transmission line.

A wide range of techniques have been proposed to track the position of interventional instruments in magnetic resonance. Among these, active tracking with device-borne miniature receive coils have proven to be very fast and comfortable with almost any imaging sequence. Also, interventional instruments with local imaging coils have been used for intravascular imaging.

Ackermann D. L. et al., Proc. of 5th SMRM, 1131 (1986) and C. L. Dumoulin et al., "Real time position monitoring of invasive devices using magnetic resonance", Magn. Reson. Med. 29, 411-415 (1993) disclose for example a real time position monitoring of invasive devices using magnetic resonance. In this technique, projections of the entire patient, or in general of the entire object to be imaged, onto one spatial direction are acquired with such miniature coils.

Due to the local reception characteristics of the miniature coils the projections resemble signal only at the position of the coil. For a device with one tip coil, a simple maximum search along the projector reveals the respective coordinate of the coil. This scheme is typically repeated for projections along the x, y and z direction to obtain the 3D coordinates of the coil in only three sequence repetition times, usually in the order of 20 milliseconds.

The underlying principle of such kind of MR tip tracking is to provide a magnetic field which varies monotonically with the local position, which as a consequence also leads to a variation of the resonance frequency of a sample with the position. The miniature receive coil incorporated for example into an interventional device will pick up an RF signal with a locally specific RF frequency which thus permits to track the position and/or orientation of the device within the coordinate system defined by the magnetic field gradients of the MR imaging system.

However, cable connections to MR receive coils and active interventional devices can cause strong RF heating especially at the tip of such devices. This is known for example from Ladd M E, Quick H H, Boesiger P, McKinnon G C. RF heating of actively visualized catheters and guidewires. In: Proceedings of the ISMRM, 6th Scientific Meeting and Exhibition, Sydney, 1998. p 473, as well as from Konings M K, Bartels L W, Smits H F M and Bakker C J G 2000 Heating around intravascular guidewires by resonating RF waves J. Magn. Reson. Imaging 12 79-85 and Nitz W R, Oppelt A, Renz W et al. On the heating of linear conductive structures as guide wires and catheters in interventional MRI. J Magn Reson Imaging 2001; 13:105-114.

The reason for strong RF heating is due to resonances of the transmission line. If such a resonance occurs, the incident RF wave is bounced back at the end points of the wire-like structure which causes the reflected RF waves to travel back and forth along the longitudinal axis of the conductive structure in such a way, that standing RF waves are formed. These standing RF waves lead to a strong heat dissipation. In order to solve the problem of heat dissipation and thus the problem of standing RF waves, transformer based cables (safe transformer lines, STL) have been proposed that avoid such heating, for example in Schulz V, Gleich B.: Magnetic resonance imaging apparatus provided with an electrical accessory device. Priority 23 Oct. 2002 at German Patent Office as DE10249239.5. International Filing on 15 Oct. 2003 as PCT/IB03/04589; Weiss S, Vernickel P, Schaeffter T, Schulz V, Gleich B. Transmission Line for Improved RF Safety of Interventional Devices. Magn Reson Med 2005; 54:182-189; Vernickel P, Schulz V, Weiss S, Gleich B. A Safe Transmission Line for MRI. IEEE Trans BME 2005; 52(6):1094-1102.

A 'transformer based cable' consists of cable sections connected by 'transformers', i.e. inductive coupling elements, which block currents that would lead to RF heating. A schematic view of an electrically conductive transmission line 100 is shown in the view of FIG. 1, wherein the transmission line consists of inductive coupling elements 106 for coupling lead segments 104 of the transmission line. The end of the transmission line is terminated by a miniature coil 102.

A transmission line of this kind is known for example from WO 2006/003566 A1.

As further shown in the schematic views of FIGS. 2a and b, the transformers are realized as resonant single loop transformers to achieve high signal transmission and miniaturization. For example, a substrate 200 is used, like a printed circuit board (PCB) substrate on which the lead segments 104 are printed on top of each other. This leads to an inductive coupling between 'neighboring' lead segments of the transmission line 100. FIG. 2 is a top view of the electrically conductive transmission line, wherein FIG. 2b is a respective side view.

The transformer 106 comprises in-plane loops. A first and second loop with a cross section of about 25×25 µm are provided with a length of about 5 cm. The lateral distance in FIG. 2a is about 500 µm and the horizontal distance in FIG. 2b is about 127 µm. The first and second loop couple inductively.

It is a goal of the invention to provide an improved electrically conductive transmission line and an improved invasive medical instrument.

SUMMARY OF THE INVENTION

However, an insight of the present invention is for example catheters with active tracking coils connected to a safe transformer line have the problem, that the transformers themselves are resonant, since they represent elongated miniature receive coils similar to the local receive coil at a tip of the catheter. Depending on the orientation of tip coil and transformers, the signal of the transformers in a tracking projection may indeed become larger than that of a tip coil. This is illustrated in an exemplary manner in FIG. 3.

The present invention provides an electrically conductive transmission line adapted for use in a magnet bore of a magnetic resonance system, the line comprising at least one inductive coupling element for coupling at least two lead segments of the line, wherein the coupling element further comprises a paramagnetic and/or ferromagnetic material.

Interventional instruments equipped with a local magnetic resonance imaging coil connected to a transformer based cable have a similar problem as described above for tracking coils. Since a local imaging coil provides signal only in a small volume around the coil, imaging sequences usually encode only a small field of view around the coil. This results for example in a low number of phase encoding steps per image and saves imaging time. The transformers of the transformer based cable provide additional signal outside the encoded field of view. This raises the problem that this additional signal is aliased into the encoded field of view for example along the phase encoding direction. This additional signal received by the transformer thus creates an artifact in the imaging field of view which may obscure the actual signal received by the imaging coil.

Embodiments of the invention have the advantage that the paramagnetic and/or ferromagnetic material leads to a strong local inhomogeneity of the static magnetic fields $B_0$, which causes the spins within one voxel (three-dimensional pixel) to dephase, such that their signal cancels out in the close vicinity of the transformer, i.e. coupling element. This leads to a signal void in the range of the transformer, i.e. the coupling element. As a consequence, the coupling element acting as an RF receiver coil will not be able to pick up anymore any RF signals emanating from spins located within the magnet bore which have been excited by an excitation pulse by for example a body coil.

In accordance with an embodiment of the invention, the coupling element comprises the paramagnetic and/or ferromagnetic material as micro-coating. Preferably, the micro-coating comprises the paramagnetic and/or ferromagnetic material as micro and/or nano particles. Depending on the size of the particles, the particles may also comprise super paramagnetic particles which have the advantage of being non-magnetic without external magnetic field and being highly magnetic in case an external magnetic field, like the static magnetic field $B_0$ of the main magnet is applied.

In accordance with an embodiment of the invention, the micro-coating may be formed by a lacquer coat comprising the magnetic and/or ferromagnetic particles. This has the advantage of an easy manufacturability since the lacquer comprising the paramagnetic and/or ferromagnetic particles can be easily sprayed or painted onto the coupling element. It is also possible, that the coupling element is immersed into the lacquer. Further, by means of a lacquer it is ensured that in a homogeneous manner the coupling element is coated by the paramagnetic and/or ferromagnetic material.

A further advantage of a coating is that the amount of paramagnetic and/or ferromagnetic material used for coating can be controlled in an easy manner. If for example a lacquer coating is applied to the coupling element, the lacquer can be diluted such that the size of the signal void can be controlled.

The amount of for example iron required for a large artifact is very small. In case of a lacquer, the layer of iron and lacquer has preferably a thickness in between 1-30 micrometers, which does not comprise the miniaturization of the transformer. It has to be noted, that the presence of iron in a lacquer, preferably a non-conductive lacquer does also not comprise the transmission properties of the transformer.

Further, in accordance with an embodiment of the invention preferably the maximum diameter of the particles is 10-20 micrometers, preferably less than 5 micrometers.

In accordance with an embodiment of the invention, the coupling element comprises the paramagnetic and/or ferromagnetic material as a wire, wherein the wire comprises the paramagnetic and/or ferromagnetic material. For example, the wire is attached to only the coupling element. Alternatively, multiple short sections of wire may be applied to the coupling element. However, it is also possible that the wire extends along the lead segments of the line and the coupling element. For example, in case the transmission line is part of a catheter, such a wire may be additionally provided with the transmission line and running in parallel to the transmission line. The only precondition to the wire is that the presence of the wire does not affect the MR signal reception capabilities of the tip coil attached to the transmission line tip.

For example, the wire may be a steel wire with a diameter in between 10-100 micrometers, preferably 50 micrometers.

In accordance with a further embodiment of the invention, the coupling element is comprised on a substrate, wherein the substrate comprises the paramagnetic and/or ferromagnetic material. For example, multilayer laminates of metal and dielectric materials as those used for printed circuit boards (PCB) can be used for this purpose. Transformers can be realized by for example discreet elements, e.g. surface mounted devices (SMD) placed onto the PCB, embedded capacitors based on dielectric layers of the laminate itself or by embedded capacitors based on materials with dielectric constant and low loss that are added in thin film technology to the laminate. In this case, if the substrate already contains for example small iron particles, nuclear spins in close vicinity to the substrate will be dephased, such that their signals cancel out. This leads to the signal void in the range of the transformers.

In accordance with a further embodiment of the invention, the ferromagnetic material is comprised in a foil, the foil being attached to the coupling element. For example, the foil may comprise the magnetic particles such that the foil can be laminated onto at least one side of the transformer or even wrapped around the transformers or even around the complete transmission line itself. Again, the important limitation is that the tip coil attached to the transmission line can still be used for MR coil tracking purposes.

An advantage of an embodiment in which a foil is wound around the coupling element is that in this case the coupling element may be encased in a Faraday cage-like wrapping. This has the additional advantage, that for example in case water-like structures are imaged, the transformer is shielded from the nuclear spins around the transmission line with a miniature Faraday cage. The effect is that the receive sensitivity of the transformer is thus limited only to the inside of the shield, where no water is present. Hence, no MR signal is received by the transformer. The only precondition for a Faraday cage is that the paramagnetic and/or ferromagnetic particles are either electrically conductive and interconnected in a network like structure for providing current path between each other, or that alternatively or additionally the foil itself is electrically conductive.

In case of conductive foil, the required thickness is only about two times the skin depth of the receiver frequency, which in case of a copper foil for example is only 16 micrometers. Hence, miniaturization of the transformer is not compromised. Due to the presence of the shield, the shape of the flux through the transformer loops is affected, which will change the inductance and mutual inductance of the transformer loops. However, this effect can be cancelled out by using different capacitances in the matching networks located at either end of the transformer or by changing geometrical parameters, preferably the length of the transformer, effectively changing its inductance.

In accordance with a further embodiment of the invention, the transmission line further comprises a carrier tube, the carrier tube enclosing the transmission line, wherein the paramagnetic and/or ferromagnetic material is spatially located on the carrier tube, preferably only at the positions where the coupling elements are spatially located. In case the carrier tube comprises the paramagnetic and/or ferromagnetic particles or material on its whole surface, it is cheap and easy to manufacture separately the carrier tube and the transmission line and then to assemble the carrier tube and the transmission line. As a consequence, various kinds of transmission lines can be designed for different types of catheters, wherein only one common type of carrier tube needs to be designed adapted to receive the different kinds of transmission lines. Nevertheless, the additional step of providing paramagnetic and/or ferromagnetic material has to be only carried out once, namely during the production process of the carrier tube. This allows for example for a cheap 'upgrade' of state of the art transmission lines of for example catheters with newly designed carrier tubes comprising paramagnetic and/or ferromagnetic materials to avoid creation of MR signals near the transformers or to avoid signal reception by the transformers.

In accordance with a further embodiment of the invention, the coupling element is encased in a Faraday cage. This Faraday cage can be formed by a separate element like a for example conductive mesh, a conductive foil, and/or the Faraday cage can be formed by a conductive network formed by the paramagnetic and/or ferromagnetic material. I.e. the Faraday cage may 'comprise the paramagnetic and/or ferromagnetic material'.

In another aspect, the invention relates to an invasive medical instrument comprising at least one magnetic resonance coil for tracking or imaging in the transmission line according to the invention, wherein the coil is hieratically connected to a lead segment of the transmission line. For example, the instrument is a catheter.

In another aspect, the invention relates to electrically conductive transmission line adapted for use in a magnet bore of a magnetic resonance system, the line comprising at least one inductive coupling element for coupling at least two lead segments of the line, wherein the coupling element is encased in a Faraday cage, as already discussed above. For example, the Faraday cage comprises a coaxial tube encasing the coupling element. It is also possible, that the Faraday cage comprises a preferably conductive foil wrapped around the coupling element.

BRIEF DESCRIPTION OF THE DRAWINGS

In the following preferred embodiments of the invention are described in greater detail by way of example only making reference to the drawings in which:

FIG. 1 is a schematic illustrating a prior art electrically conductive transmission line, FIG. 2 is a schematic illustrating a top and side view of a prior art transmission line, FIG. 4 is a schematic illustrating a transformer line in accordance with an embodiment of the invention connected to a miniature receiver coil at a device tip, wherein the transformer line comprises paramagnetic and/or ferromagnetic particles at the area of the coupling element, FIG. 5 is another schematic view of a transformer line in which a foil comprising paramagnetic and/or ferromagnetic materials is attached to the transformer line, FIG. 6 is a schematic side view of a transmission line 100 comprised on a substrate, FIG. 7 is a schematic side view of a transmission line, wherein two lead segments are shown which are coupled to each other by means of a coupling element, FIG. 8 is a schematic side view of a transmission line comprising a layer of paramagnetic and/or ferromagnetic material encasing a coupling element, FIG. 9 is a schematic side view of a transmission line comprising a substrate which comprises paramagnetic and/or ferromagnetic material.

In the following, similar elements are depicted by the same reference numerals.

DETAILED DESCRIPTION OF THE DRAWINGS

Figure 3A:
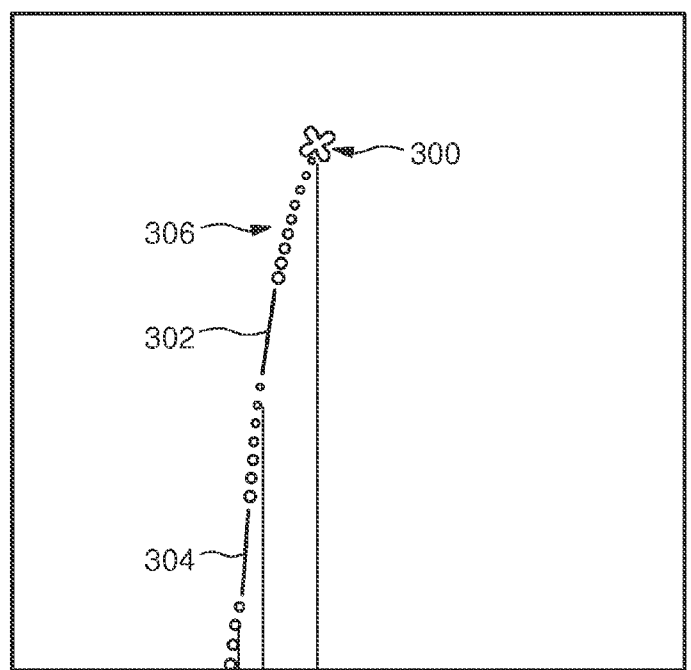
FIG. 3 shows an MR image of a tip coil and two prior art transformers, as well as the signal intensity of a horizontal tracking projection.
Figure 3B:
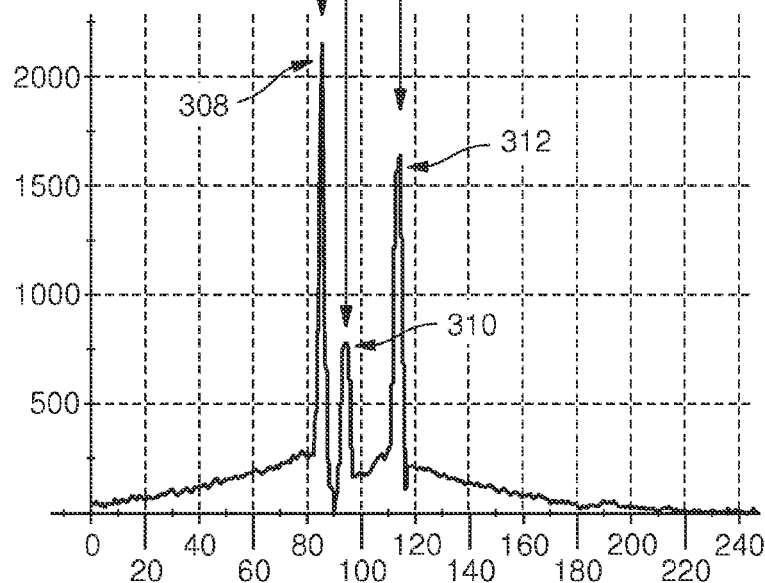

FIG. 3a shows are MR image of a tip coil (bright spot 300) and two transformers (elongated spots 302 and 304) which appear as long bright stripes. The dots 306 interconnecting the transformers 304, 302 and the tip coil 300 are only shown in an illustrative manner and indicate the presence of lead segments interconnecting the tip coil 300 and the transformers 302 and 304. FIG. 3b displays the signal intensity of a horizontal tracking projection, i.e. the projection of the signal or the horizontal axis. Here, the problem arises that a signal of the transformers 304 and 302 is collected in a few pixels of the projection. As a result, the signal of the transformers is elevated and in fact, the signal peak 308 of the transformer 304 is larger than that of the peak 312 of the tip coil 300. Here, a maximum search algorithm would result in a wrong coordinate regarding the spatial location of the tip coil 300. The peak 310 corresponds to the transformer 302.

As a consequence, an analysis of the peak intensities in an MR measurement may lead to false tracking of the tip coil 300, i.e. the MR system does not find the correct position of the tip coil. As a consequence, the system would not provide the correct position of the tip coil which may strongly mislead an interventionist. For example, the interventionist in a heart surgery process by means of a catheter may be mislead by the MR system in a manner that the tip position is reported to be at an anatomically life threatening position outside the heart which indicates perforation of the heart wall, while the catheter tip is actually still inside the heart in a non-dangerous position.

Additionally, if automatic slice tracking in magnetic resonance imaging is used, the image slice will be set to a wrong position which does not contain the catheter tip. The slice may be set far from the actual tip position of the MR system, which is equally dangerous during an intervention, because real time image control over the catheter is lost.

FIG. 4 illustrates a schematic view of an electrically conductive transmission line 100 adapted for use in a magnet bore of a magnetic resonance system. For example, the transmission line is part of a catheter for being inserted in the human body.

This transmission line 100 is especially provided for connecting an electrical device, like for example an accessory device of a magnetic resonance (MR) imaging system, to a connection unit, like for example a power supply or a control unit. However, the transmission line can as well be used for connecting implants especially with long conductors or electrodes, like for example heart pacemakers or artificial nerves, for supplying power to preamplifiers, for MR compatible IVUS (intra vascular ultra sound) devices, for multieye tracking of catheters or guide wires during MR image generation, and other applications which require a connection lead or transmission line which is safe when guided through a RF field (for example generated by a MR imaging system).

In order to allow a highly precise localization of the catheter tip within an object to be imaged, like for example the human body, the transmission line comprises on its tip a receive coil 102. RF signals picked up by the receive coil 102 are transmitted by means of the lead segments 104 and the coupling elements 106 to a respective receiver of the MR system. Each lead segment 104 consists of two wires which are connected to a transformer 106. As already explained in detail above, the purpose of the coupling elements 106 (transformers) is to block currents that would lead to RF heating. For example, the transformers are realized as resonance single loop transformers to achieve high signal transmission and miniaturization.

The coupling elements 106 further comprise a paramagnetic and/or ferromagnetic material. In the embodiment shown in FIG. 4, the paramagnetic and/or ferromagnetic material is shown as an area 400, like for example a foil with magnetic particles which are attached to the coupling elements 106.

While in FIG. 4 the magnetic particles are attached only to the coupling elements 106 and are thus spatially limited in size such that only the coupling elements 106 are overlapped by the foil 400 comprising the magnetic particles, in FIG. 5 a foil 500 comprising magnetic particles extends along the longitudinal axis of the transmission line thus overlapping all coupling elements 106 and at least some of the lead segments 104 of the transmission line. For example, for this purpose the foil 500 comprising paramagnetic particles may be wrapped around the electrically conductive transmission line. If additionally, the magnetic particles form an electrically conductive network and/or in case the foil 500 itself is electrically conductive, the magnetic particles and/or the foil form a Faraday cage which limits the receive sensitivity of the coupling elements to the region inside the wrapped foil 500. As a consequence, the only signal picked up by means of the transmission line is the RF signal picked up by the coil 102.

In the embodiment shown in FIG. 6, the transmission line 100 is comprised on a substrate 600, wherein in the areas which are in close vicinity to the coupling elements 106, the substrate 600 comprises sections 602 with paramagnetic and/or ferromagnetic particles. In a different embodiment, the complete substrate 600 may comprise the sections 602 with magnetic particles. This is discussed below with respect to FIG. 9.

FIG. 7 illustrates a side view of a transmission line 100, wherein two lead segments 104 are shown which are coupled to each other by means of a coupling element 106. The lead segments 104 are comprised on a substrate 200, like for example a PCB substrate. Preferably, the lead segments 104 are copper segments.

Attached to the substrate 200 is an element 700 comprising paramagnetic and/or ferromagnetic particles. The element 700 may either be a wire made of a magnetic material or comprising magnetic particles or the element 700 may be a foil comprising the paramagnetic and/or ferromagnetic particles.

For example, FIG. 7 is a side view of one of the coupling elements 106 illustrated in the top view of FIG. 4. In this case the element 700 is a foil comprising the magnetic particles.

In a further embodiment of the invention, the element 700 may be a wire which is arranged in a plane parallel to the plane in which the coupling element 106 is located on the substrate 200. Preferably, the wire 700 has only a length which corresponds to the length of the coupling element. In case a coupling element 106 as illustrated in FIGS. 2a and b is used, the length of the wire 700 is about the length of the coupling element 106 seen in the longitudinal direction of the coupling element 106.

FIG. 8 is a side view of FIG. 5 where it is assumed that a foil 500 is used to enwrap the coupling elements 106 and a part of the lead segments 104. As can be seen in FIG. 8, the coupling element 106 is enwrapped or even encased in the foil 500 comprising the paramagnetic and/or ferromagnetic particles. In this case, the foil 500 may act as a Faraday cage, if the foil itself is electrically conductive or if the magnetic particles form a conductive network.

FIG. 9 is a side view of a transmission line, wherein the transmission line comprises a coupling element 106 and two lead segments 104, wherein the lead segments and the coupling element are located on a substrate 900. The substrate 900 comprises the magnetic particles in a homogeneously distributed manner.

Figure 10:
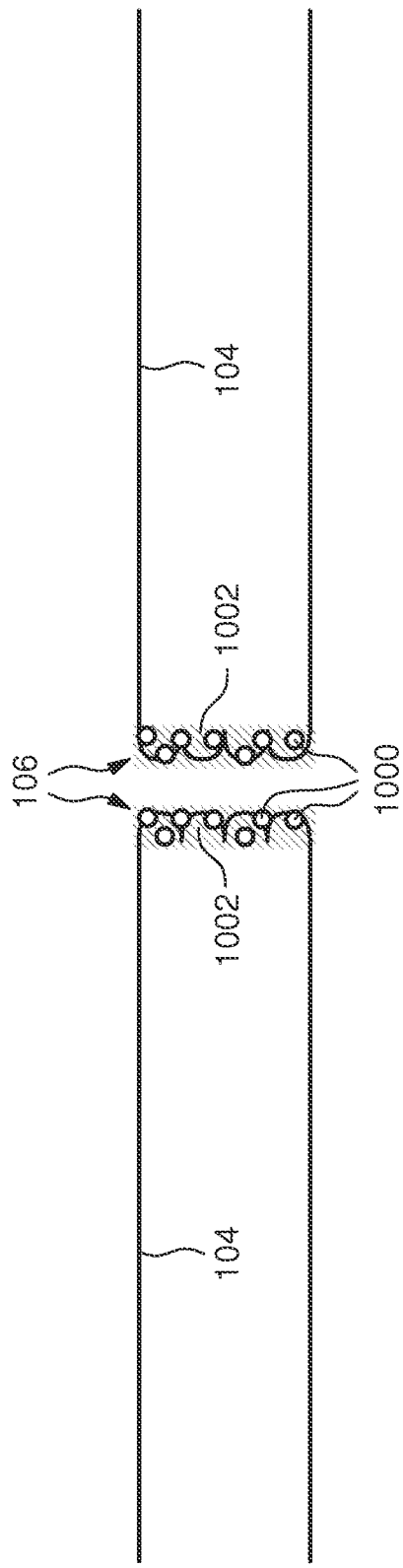
FIG. 10 is a schematic view of a transmission line comprising a lacquer coat comprising paramagnetic and/or ferromagnetic materials.

FIG. 10 is a further schematic top view of a transmission line comprising two coupling elements 106 and lead segments 104. A suspension of iron particles in a lacquer was applied to the coupling elements 106. After drying, the coupling element 106 comprises the dried lacquer 1002 and the magnetic iron particles 1000. As a consequence, a strong local inhomogeneity of the static external magnetic field $B_0$ which causes the spins within one voxel to dephase is present in the spatial area around the coupling elements 106.

Figure 11:
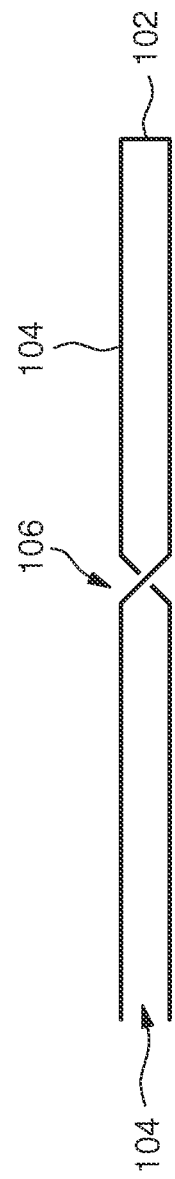
FIG. 11 is a schematic view of a single twist of a primary loop of a transformer and a secondary loop of a transformer.

A further possibility to avoid an unwanted signal reception by transformers is illustrated in FIG. 11. The transformer 106 is twisted one or several times along its longitudinal axis. Along with this twist the spatial receive sensitivity of the transformer is twisted. As a result, signal contributions from different positions along one transformer have a difference signal phase. FIG. 3 illustrates that the signal peaks from the transformer are largest for the tracking projection oriented perpendicular to the long axis of the transformer. However, in that orientation, the different phases of the signal contributions from different positions along a transformer will cause destructive interference of these contributions, because they are more or less all projected into the same pixel of the projection. Effectively, this concept works best when the problem is largest due to orientation.

Twisting of the transformer 106 may be achieved simply by direct twisting, which does meet the requirements regarding miniaturization, because the transformer comprises a flat structure. Twisting may also be achieved by crossing the individual loops of the transformers as depicted in FIG. 11. Similarly, several twists may be applied along one transformer. The current untwisted transformers may be implemented as a three-layer board (copper-PTFE-copper). Twists may also be implemented by additional layers and corresponding connections between layers like in a multilayer circuit board.

Figure 12A:
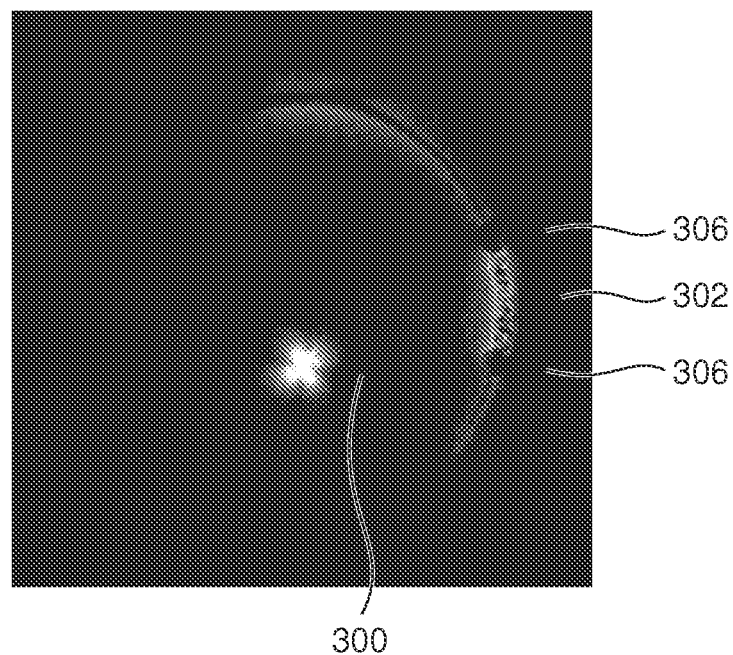
FIG. 12 shows an MR image illustrating signal dephasing caused by application of a suspension of 6 micrometer large iron particles in a lacquer to a transformer.

FIG. 12 illustrates a signal dephasing caused by the application of a suspension of 6 micrometer large iron particles in a lacquer to a transformer. The transformer spot 302 intensity is much lower than the spot 300 intensity originating from the tip coil. Comparing FIG. 12a to FIG. 3a, it becomes clear that the signal intensity of the transformer can be drastically reduced. In FIG. 3a, the transformer spot 304 intensity was similarly high as the spot 300 intensity of the tip coil, whereas in FIG. 12a due to the application of the suspension of iron particles to the transformer the spot 302 intensity is much lower than the spot 300 intensity of the tip coil.

Figure 12B:
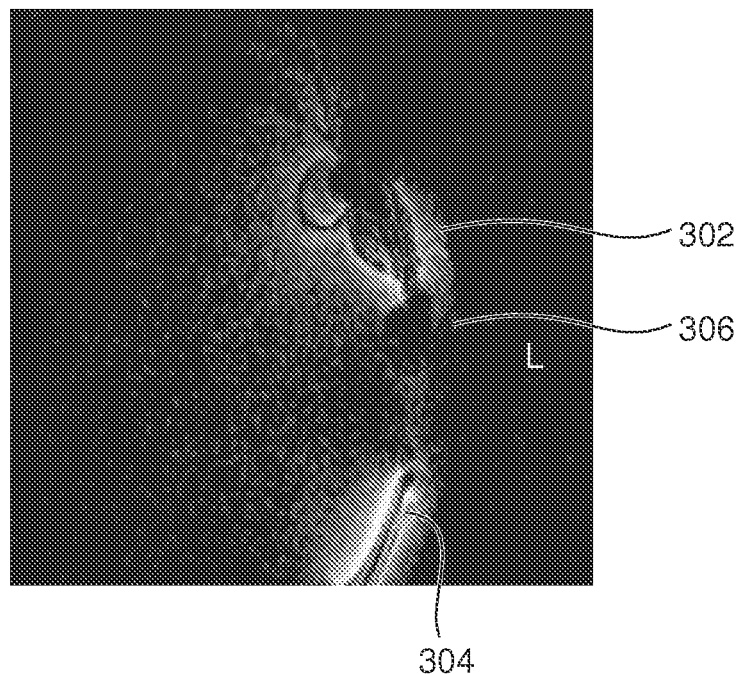

Further, in FIG. 12b the remaining spots 302 and 304 of two transformers that have been treated with different amounts of iron are compared. The upper transformer with more iron reveals less signal intensity of the spot 302. It has to be noted, that the signal level in FIG. 12b is highly elevated compared to the signal level in FIG. 12a in order to visualize the transformers.

REFERENCE NUMERALS 100 transmission line
102 tip coil 104 lead segment
106 coupling element
200 substrate
300 tip coil signal
302 transformer signal
304 transformer signal
306 lead segment signal
308 spot
310 spot
312 spot
400 foil
500 foil
600 substrate
602 substrate section comprising magnetic particles
700 wire
900 substrate comprising magnetic particles
1000 magnetic particles
1002 lacquer

The invention claimed is:

1. An electrically conductive transmission line configured for use in a magnet bore of a magnetic resonance system, the electrically conductive transmission line comprising:
   at least two lead segments; and
   at least one inductive coupling element for coupling the at least two lead segments, wherein the at least one inductive coupling element comprises a coil and additional element comprising at least one of a paramagnetic and ferromagnetic material, wherein the additional element comprises a foil, the foil being at least partially wrapped around the at least one inductive coupling element.

2. The electrically conductive transmission line of claim 1, wherein the additional element comprises a micro coating.

3. The electrically conductive transmission line of claim 2, wherein the micro coating comprises the at least one of paramagnetic and ferromagnetic material as at least one of micro and nano particles.

4. The electrically conductive transmission line of claim 3, wherein the micro coating is formed by a lacquer coat comprising the at least one of paramagnetic and ferromagnetic particles.

5. The electrically conductive transmission line of claim 1, wherein the additional element comprises a wire or multiple short sections of wire, wherein the wire comprises the at least one of paramagnetic and ferromagnetic material.

6. The electrically conductive transmission line of claim 1, wherein the at least one inductive coupling element is formed on a substrate, wherein the substrate comprises the at least one of paramagnetic and ferromagnetic material.

7. The electrically conductive transmission line of claim 1, further comprising a carrier tube, the carrier tube enclosing the electrically conductive transmission line, wherein the at least one of paramagnetic and ferromagnetic material is spatially located on the carrier tube.

8. The electrically conductive transmission line of claim 1, wherein the additional element comprises a Faraday cage encasing the at least one inductive coupling element.

9. The electrically conductive transmission line of claim 8, wherein the Faraday cage comprises the at least one of paramagnetic and ferromagnetic material.

10. An invasive medical instrument comprising a magnetic resonance coil used for tracking or imaging and a transmission line, the transmission line comprising:
    at least two lead segments; and
    at least one inductive coupling element for coupling the at least two lead segments, wherein the at least one inductive coupling element comprises a coupling coil and additional element comprising at least one of a paramagnetic and ferromagnetic material,
    wherein the magnetic resonance coil is electrically connected to a lead segment of the at least two lead segments, wherein the additional element comprises a foil, the foil being at least partially wrapped around the at least one inductive coupling element.

11. The instrument of claim 10, wherein the instrument is a catheter.

12. An electrically conductive transmission line configured for use in the magnet bore of a magnetic resonance system, the electrically conductive transmission line comprising:
    at least two lead segments; and
    at least one inductive coupling element for coupling the at least two lead segments, wherein the at least one inductive coupling element is encased in a Faraday cage, wherein the Faraday cage comprises a foil wrapped around the at least one inductive coupling element.

13. The electrically conductive transmission line of claim 12, wherein the Faraday cage comprises a coaxial tube encasing the at least one inductive coupling element.

* * * * *